(12) United States Patent
Li et al.

(10) Patent No.: US 8,089,267 B2
(45) Date of Patent: Jan. 3, 2012

(54) SYSTEM FOR OPERATING DIFFERENTIAL PROBE

(75) Inventors: Shen-Chun Li, Taipei Hsien (TW); Shou-Kuo Hsu, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 367 days.

(21) Appl. No.: 12/546,703

(22) Filed: Aug. 25, 2009

(65) Prior Publication Data
US 2010/0308798 A1 Dec. 9, 2010

(30) Foreign Application Priority Data
Jun. 4, 2009 (CN) .......................... 2009 1 0302928

(51) Int. Cl.
*G01R 1/06* (2006.01)
*G01R 31/00* (2006.01)

(52) U.S. Cl. ............... 324/149; 324/750.16; 324/755.01
(58) Field of Classification Search .................. 324/149, 324/750.16, 755.01
See application file for complete search history.

(56) References Cited

U.S. PATENT DOCUMENTS

| | | | | |
|---|---|---|---|---|
| 6,404,215 B1* | 6/2002 | Nightingale et al. | .... | 324/756.04 |
| 6,831,452 B2* | 12/2004 | McTigue | ...................... | 324/72.5 |
| 7,942,305 B1* | 5/2011 | Li et al. | .......................... | 228/6.2 |

* cited by examiner

*Primary Examiner* — Reena Aurora
(74) *Attorney, Agent, or Firm* — Altis Law Group, Inc.

(57) ABSTRACT

A system for operating a differential probe which includes a first metal extension and a second metal extension having the same structures is disclosed. Each of the metal extensions includes a rotatable arm, a rotatable base, and a contact end. The rotatable base and contact end of each of the metal extensions extend from two ends of the corresponding rotatable arm at an angle, the contact ends and the rotatable bases of the metal extensions are parallel to each other. The system controls a mechanical arm to adjust a horizontal distance between the contact ends to be equal to a required horizontal distance by rotating the first metal extension around the rotatable base of the second metal extension clockwise by a rotated angle, and rotating the second metal extension around the rotatable base of the first metal extension counterclockwise by the rotated angle.

9 Claims, 5 Drawing Sheets

SYSTEM FOR OPERATING DIFFERENTIAL PROBE

BACKGROUND

1. Technical Field

The present disclosure relates to operation systems for test probes, and more particularly to a system for operating a differential probe.

2. Description of Related Art

A test probe may be a physical device used to connect electronic test equipments, such as an oscilloscope, to a device under test. The test probe can transmit signals from the tip of the probe to the oscilloscope to perform a test. Different types of test probes may be used to acquire different signals, such as differential probes, which are optimized for acquiring differential signals. Differential probes must provide two signal paths that are as nearly-identical as possible, matching in overall attenuation, frequency response, and time delay. A modern differential probe usually has two metal extensions which can be adjusted by operators to touch two points on the device under test. It is a challenging and troublesome task because the two points may be very close, and the distance between the two metal extensions must be changed according to the distance between the two points, which may cause testing error.

DETAILED DESCRIPTION

Figure 1:
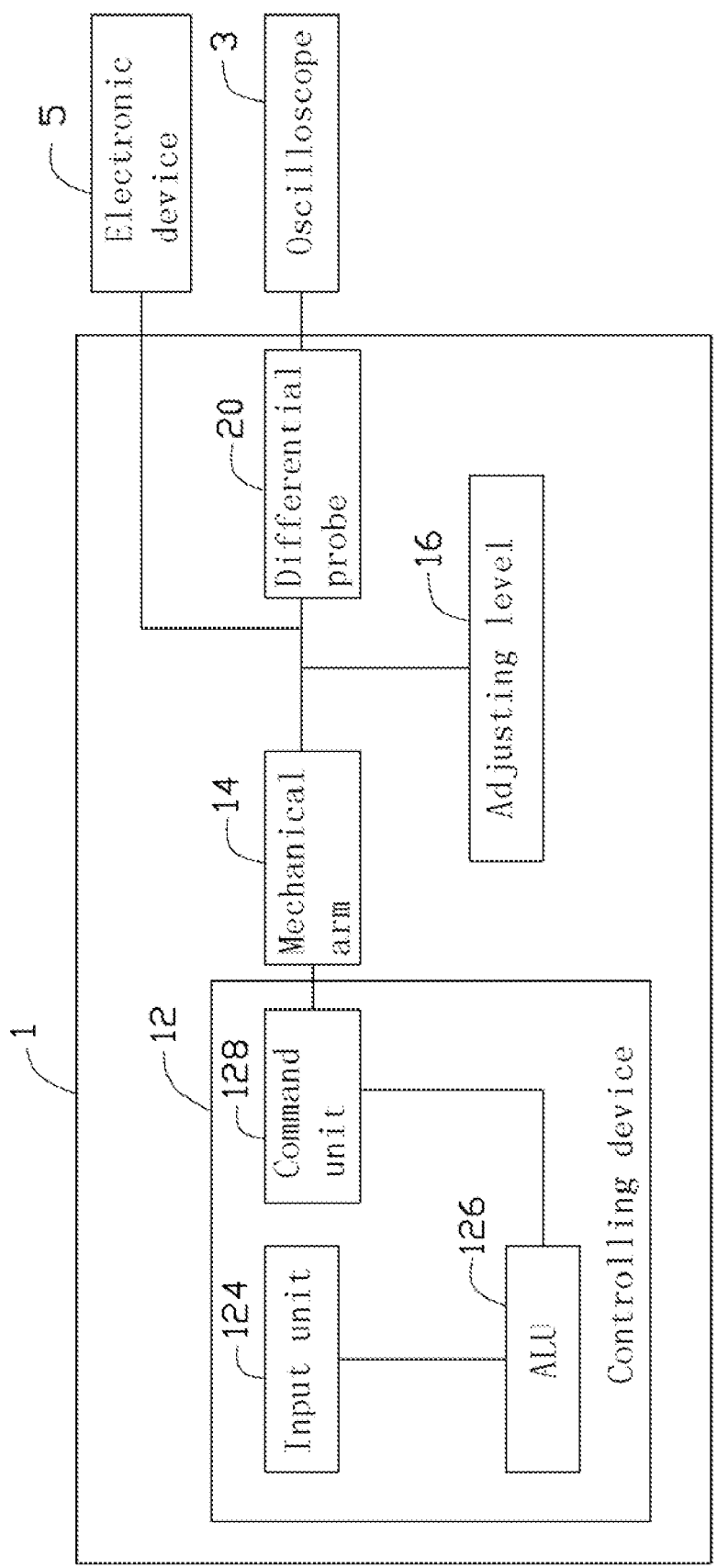
FIG. 1 is a block diagram of an embodiment of a system for operating a differential probe, the system includes an adjusting level.

Referring to FIG. 1, an embodiment of a system 1 is used to operate a differential probe 20. The differential probe connects an oscilloscope 3 to an electronic device 5 to transmit signals from the electronic device 5 to the oscilloscope 3, so as to test the electronic device 5. The system 1 includes a controlling device 12, a mechanical arm 14, and an adjusting level 16. The controlling device 12 may be a computer which includes an input unit 124, an arithmetic logic unit (ALU) 126, and a command unit 128.

Figure 2:
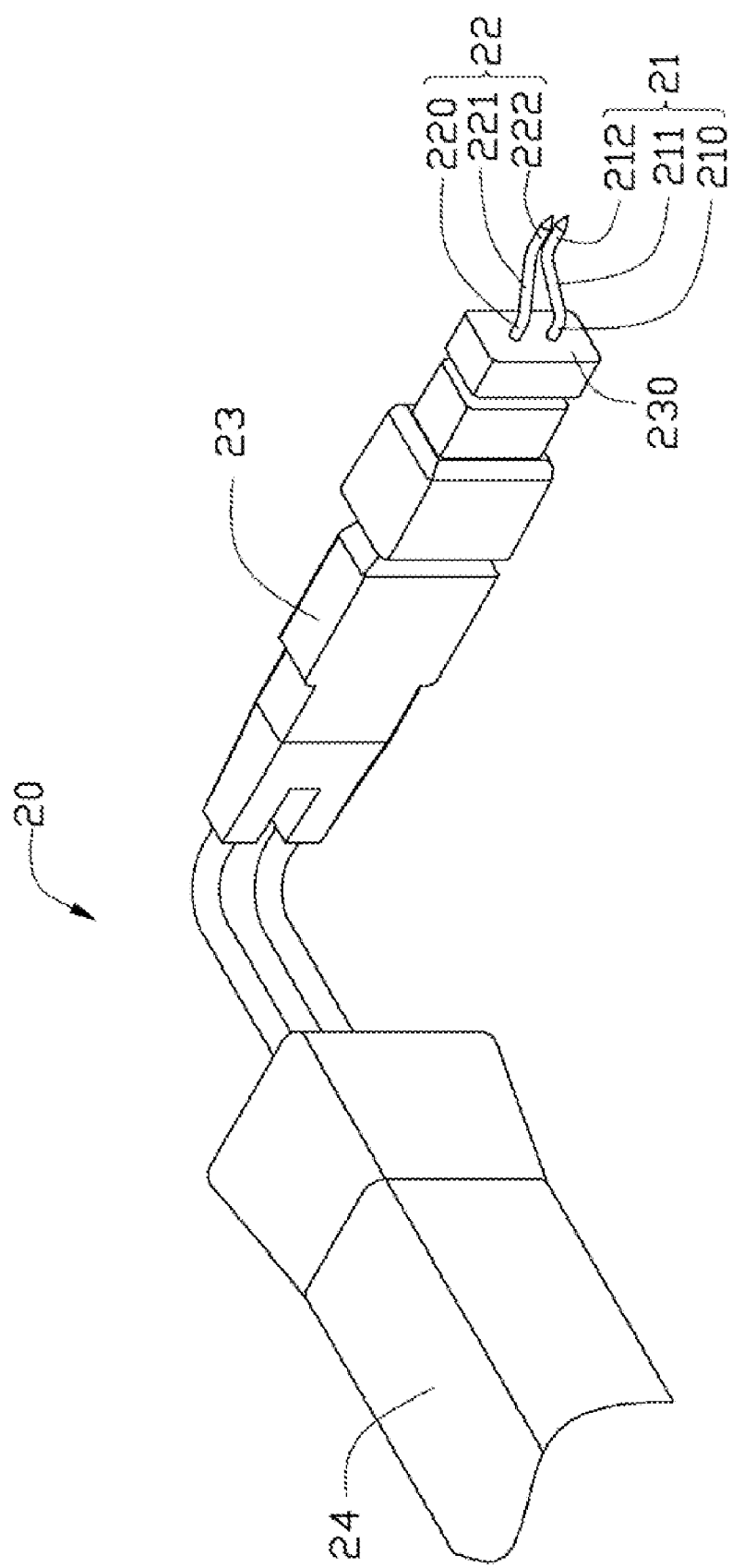
FIG. 2 is an isometric view of the differential probe of FIG. 1.

Referring to FIG. 2, the differential probe 20 includes a main body 23, and two metal extensions 21, and 22. The metal extension 21 includes a rotatable base 210, a rotatable arm 211, and a contact end 212. The rotatable base 210 and the contact end 212 respectively extends from opposite ends of the rotatable arm 211 at an angle. The angle between the rotatable base 210 and the rotatable arm 211 is greater than 0 degrees and is less than 180 degrees. The contact end 212 is parallel to the rotatable base 210. The metal extension 22 includes a rotatable base 220, a rotatable arm 221, and a contact end 222. The metal extension 22 has the same structure as the metal extension 21. The rotatable bases 210 and 220 are inserted in an end of the main body 23, and are vertical to an end surface 230 of the end of the main body 23. The metal extensions 21 and 22 rotates when the rotatable bases 210 and 220 rotates correspondingly, therefore, a distance between the two contact ends 212 and 222 is adjustable. In this embodiment, the two extensions 21 and 22 function as input terminals of the differential probe 20. The contact ends 212 and 222 are used to sense signal pairs by contacting two test points of the electronic device 5. The differential probe 20 further includes an output terminal 24 which transmits the signal pairs to the oscilloscope 3.

The system 1 is used to adjust the distance between the contact ends 212 and 222, according to the distance between the two test points of the electronic device 5. The distance between the contact ends 212 and 222 is adjusted by rotating the two extensions 21 and 22 by controlling the 14 with the 12.

Figure 3:
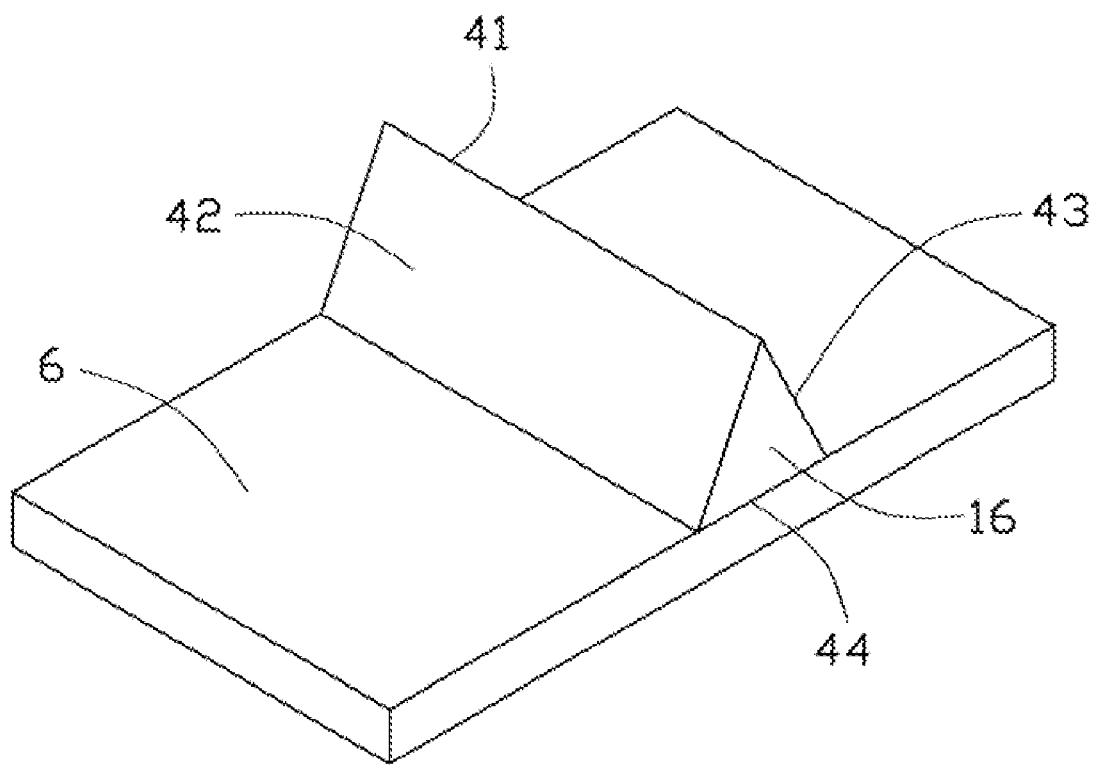
FIG. 3 is a schematic view of the adjusting level of FIG. 1.
Figure 4:
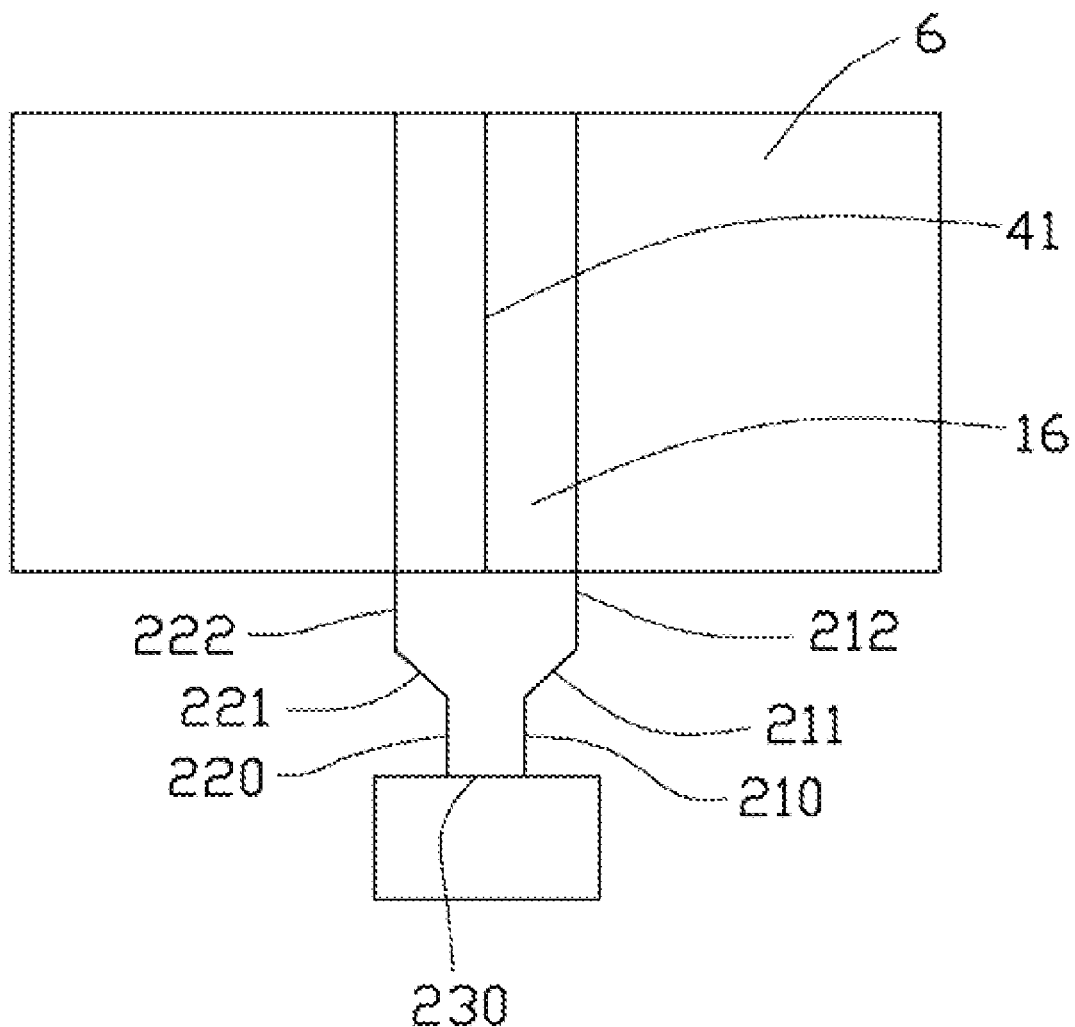
FIG. 4 is a schematic view of the differential probe positioned by the adjusting level of FIG. 1.
Figure 5:
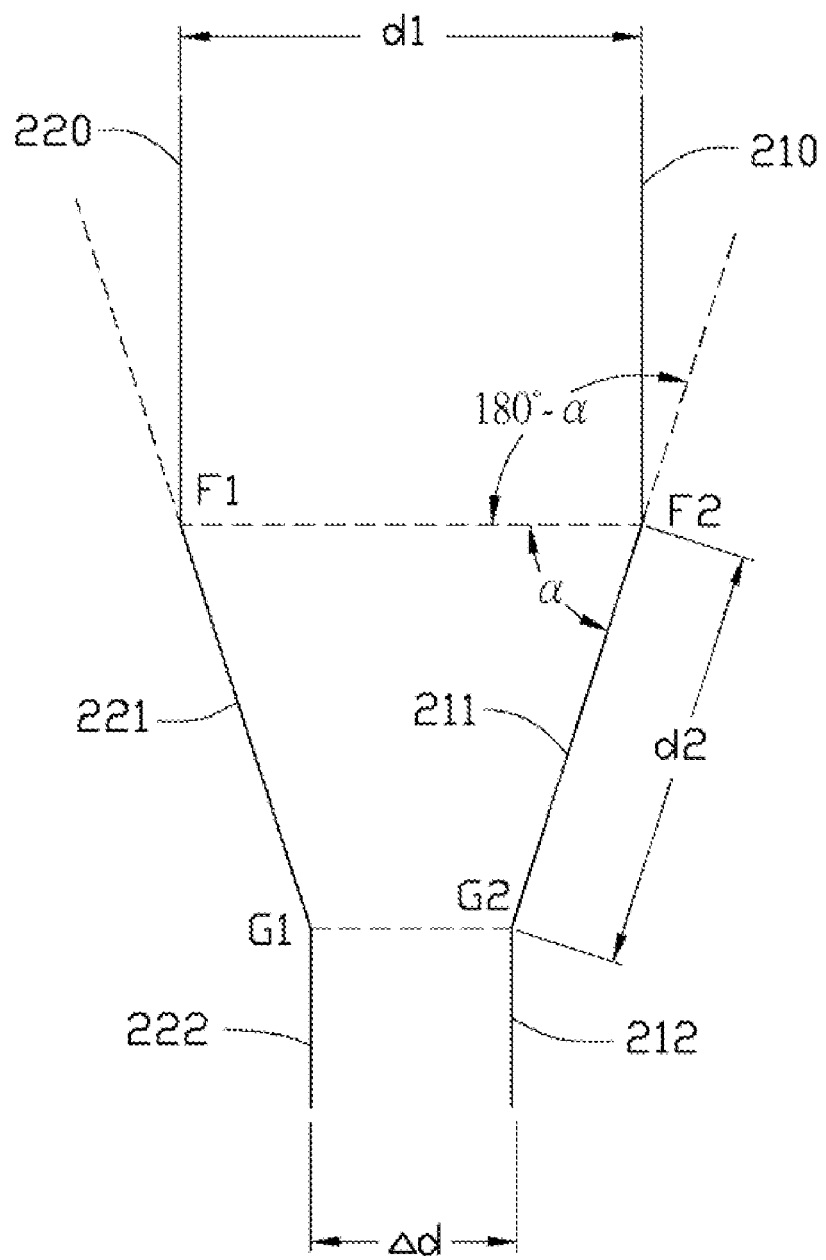
FIG. 5 is a schematic view of the differential probe being operated at a second position by the system of FIG. 1.

Referring to FIGS. 3-5, the mechanical arm 14 may drive the metal extensions 21 and 22 to move a first distance between the contact ends 212 and 222 as shown in FIG. 4 from an initial position as shown in FIG. 2. The mechanical arm 14 may also drive the metal extensions 21, 22 to move, with a second distance formed between the contact ends 212, 222 as shown in FIG. 5. The second distance between the contact ends 211, 222 is Δd, allowing the two extensions 21 and 22 to contact two test points correspondingly. In this embodiment, the contact ends 212 and 222 are driven to move to form the first distance between the contact ends 212 and 222 from the initial position with the mechanical arm 14 assisted by the adjusting level 16, which is described as below.

The adjusting lever 16 has a prism like shape, and is located on a platform 6. The adjusting level 16 includes three rectangular surfaces 42, 43 and 44 connected end to end. The platform 6 is overlapped by the rectangular surface 44 of the adjusting level 14. Top sides of the surfaces 42 and 43 are intersects to form a ridge 41. The controlling device 12 may control the mechanical arm 14 to move the contact ends 212 and 222 to slide down from the ridge 41 to the platform 6, along the rectangular surfaces 42 and 43, respectively. When the contact ends 212, 222 move to the platform 6, a distance between the contact ends 212 and 222 is at the first distance. The first distance may be a maximum distance between the contact ends 212 and 222. The adjusting level 16 is used to separate the contact ends 212, 222 from each other, thereby, rotating the contact ends 212, 212. In other embodiment, the adjusting level 16 may be omitted if the contact ends 212 and 222 are apart from each other initially.

When the distance between the contact ends 212, 222 is the first distance, the controlling device 12 controls the mechanical arm 14 to remove the metal extensions 21 and 22 from the adjusting level 16. The controlling device 12 controls the mechanical arm 14 to drive the main body 23 and the metal extension 21 to rotate around the rotatable base 210 of the metal extension 21 clockwise by an angle $(180-\alpha)°$ without moving the metal extension 22, and then rotating the main body 23 back without moving the metal extensions 21 and 22. After the main body 23 is rotated back, the mechanical arm 14 drives the main body 23 and the metal extension 22 to rotate around the rotatable base 220 of the metal extension 22 counterclockwise by the angle $(180-\alpha)°$ without moving the metal extension 21, and then rotating the main body 23 back without moving the metal extensions 21 and 22. As a result, the distance between the contact ends 212 and 222 of the metal extensions 21 and 22 is at the second distance. A rotated angle of each of the rotatable arms 211 and 221 is $(180-\alpha)$.

As shown in FIG. 5, the controlling device 12 determines the value of rotated angle of each of the rotatable arms 211 and 221 according to the following equations.

$$\cos\alpha = (|d1-\Delta d|/2)/d2 \quad (1),$$

$$\alpha = \cos^{-1}[(|d1-\Delta d|/2)/d2] \quad (2),$$

wherein the equation (2) is derived from the equation (1), d1 is a horizontal distance between the rotatable bases 210 and 220, d2 is a length of each of the rotatable arms 211 and 221, α is an angle between each of the rotatable arms 211 and 221 and a straight line that connect two joint points F1 and F2, the joint points F1 connects the rotatable arm 211 and the rotatable base 210 of the metal extensions 21, the joint points F2 connects the rotatable arm 221 and the rotatable base 220 of the metal extensions 22, Δd is a predetermined value of the second distance between the contact ends 212 and 222. The second distance is predetermined to be equal to the distance between the two test points of the electronic device 5.

The equation (2) is stored in the ALU 126 of the controlling device 12. The value of the predetermined horizontal distance Δd is inputted to the ALU 126 by the input unit 124 of the controlling device 12. The input unit 124 may be a computer keyboard, a computer mouse, or other input devices. The ALU 126 calculates the value of the rotated angle (180−α) according to the inputted value of the predetermined horizontal distance Δd, and transmits a calculated result of the value of the rotated angle (180−α) to the command unit 128 of the controlling device 12. The mechanical arm 14 is controlled by the command unit 128 to rotate the main body 23 and each of the metal extensions 21 and 22 as described above, according to the calculating result of the value of the rotated angle (180−α).

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A system for operating a differential probe, wherein the differential probe comprises a first metal extension and a second metal extension both having the same structures, each of the first and second extensions comprises a rotatable base, a rotatable arm, and a contact end, the rotatable base and the contact end of each of the first and second metal extensions extend from opposite ends of the corresponding rotatable arm at an angle respectively, the contact ends and the rotatable bases of the first and second metal extensions are parallel to each other, the system comprising:
   a controlling device determining a rotated angle of each of the rotatable arms according to a length of each of the rotatable arms, a horizontal distance between the rotatable bases of the first and second metal extensions, and a required horizontal distance between the contact ends of the first and second metal extensions; and
   a mechanical arm controlled by the controlling device to adjust a horizontal distance between the contact ends of the first and second metal extensions to be the required horizontal distance, by rotating the first metal extension around the rotatable base of the second metal extension clockwise by the rotated angle, and rotating the second metal extension around the rotatable base of the first metal extension counterclockwise by the rotated angle.

2. The system of claim 1, wherein the controlling device determines the rotated angle according to an equation α=cos⁻¹[(|d1−Δd|/2)/d2], wherein α is the supplementary angle of the rotated angle, d1 is the horizontal 1 distance between the rotatable bases of the first and second metal extensions, d2 is the length of each of the rotatable arms, and Δd is the required horizontal distance.

3. The system of claim 2, wherein the controlling device is a computer which comprises:
   an arithmetic logic unit (ALU) storing the equation;
   an input unit inputting the value of the required horizontal distance to the ALU, for the ALU to calculate the rotated angle; and
   a command unit receiving the value of the rotated angle to control the mechanical arm to rotate each of the first and second metal extensions.

4. The system of claim 1, wherein the rotatable bases of the first and second metal extensions are inserted in an end of a main body of the differential probe, and are vertical to an end surface of the end of the main body, the first metal extension is rotated around the rotatable base of the second metal extension together with the main body, and the second metal extension is rotated around the rotatable base of the first metal extension together with the main body after the main body being rotated back without moving the first and second metal extensions.

5. The system of claim 1, wherein an angle between the rotatable base and the rotatable arm of each of the first and second metal extensions is greater than 0 degrees, and less than 180 degrees.

6. A system for operating a differential probe which comprises a first metal extension and a second metal extension both having the same structures, each of the first and second extensions comprises a rotatable base, a rotatable arm, and a contact end, the rotatable base and the contact end of each of the first and second metal extensions bend from opposite ends of the corresponding rotatable arm respectively, the contact ends and the rotatable bases of the first and second metal extensions are parallel to each other, the system comprising:
   a controlling device determining a rotated angle of each of the rotatable arms according to a length of each of the rotatable arms, a horizontal distance between the rotatable bases of the first and second metal extensions, and a required horizontal distance between the contact ends of the first and second metal extensions; and
   a mechanical arm controlled by the controlling device to drive the first and second metal extensions to move by rotating the first metal extension around the rotatable base of the second metal extension clockwise by the rotated angle, and rotating the second metal extension around the rotatable base of the first metal extension counterclockwise by the rotated angle, a horizontal distance between the contact ends of the first and second metal extensions changing from a first distance to a second distance; wherein
   the second distance is equal to the required horizontal distance.

7. The system of claim 6, further comprising a adjusting level having a prism like shape, the mechanical arm is controlled to drive the horizontal distance between the first and second metal extensions to change to the first distance from an initial distance by sliding down the contact ends of the first and second metal extensions from a top of the adjusting level along two adjacent surfaces of the adjusting level respectively, wherein the top is a junction line between the two rectangular surfaces.

8. The system of claim 7, wherein the contact ends are contacted each other in response to the horizontal distance between the first and second metal extensions being the initial distance.

9. The system of claim 7, wherein the contact end of the first metal extension is farthest from the contact end of the second metal extension in response to the horizontal distance between the first and second metal extensions being the first distance.

* * * * *